United States Patent [19]

Wei et al.

[11] Patent Number: 4,920,073
[45] Date of Patent: Apr. 24, 1990

[54] SELECTIVE SILICIDATION PROCESS USING A TITANIUM NITRIDE PROTECTIVE LAYER

[75] Inventors: Che-Chia Wei, Plano; Thomas E. Tang, Dallas; James G. Bohlman, Forney; Monte A. Douglas, Coppell, all of Tex.

[73] Assignee: Texas Instruments, Incorporated, Dallas, Tex.

[21] Appl. No.: 350,429

[22] Filed: May 11, 1989

[51] Int. Cl.$^5$ ........................................... H01L 21/283
[52] U.S. Cl. ..................................... 437/200; 437/192; 437/246; 148/DIG. 147; 148/DIG. 113
[58] Field of Search ............... 437/192, 200, 195, 245, 437/246; 357/67, 71; 148/DIG. 147, DIG. 113

[56] References Cited

U.S. PATENT DOCUMENTS

| | | | |
|---|---|---|---|
| 4,384,301 | 5/1983 | Tasch, Jr. et al. | 357/23 |
| 4,545,116 | 10/1985 | Lau | 148/DIG. 147 |
| 4,657,628 | 4/1987 | Holloway | 437/200 |
| 4,687,542 | 8/1987 | Davis et al. | 156/643 |
| 4,690,730 | 9/1987 | Tang et al. | 156/643 |

FOREIGN PATENT DOCUMENTS

| | | | |
|---|---|---|---|
| 0183942 | 8/1986 | Japan | 437/192 |
| 0212041 | 9/1986 | Japan | 437/200 |
| 0258447 | 11/1986 | Japan | 437/200 |

OTHER PUBLICATIONS

Tseng, et al., "A New Oxidation . . . ", *IEEE Electron Device Letters*, vol. EDL-7, No. 11, Nov. 1986, pp. 623–624.
Park, et al., "Mo/Ti Bilayer . . . ", *J. Vac. Sci. Technol.* A2(2), Apr.–Jun. 1984, pp. 259–263.
Lin, et al., "An Environment . . . ", *J. Electrochem. Soc.*, vol. 133, No. 11, Nov. 1986, pp. 2386–2389.
Ting, C. Y., "Silicide for Contacts and Interconnects", *IEDM Tech. Digest*, 1984, pp. 110–113.
Wittmer, M., et al., "Applications of TiN . . . ", *Thin Solid Films*, 93 (1982), pp. 397–405.

Primary Examiner—Brian E. Hearn
Assistant Examiner—T. N. Quach
Attorney, Agent, or Firm—Douglas A. Sorensen; Rodney M. Anderson; Melvin Sharp

[57] ABSTRACT

The present invention provides a method for inhibiting the oxidation of a titanium layer during the direct reaction of the titanium with exposed silicon areas of an integrated circuit. In one embodiment of the present invention, a titanium nitride layer is formed on the surface of the titanium layer in the reactor where the titanium layer is deposited. The titanium nitride layer provides an effective barrier against oxidation. Thus, the formation of titanium dioxide is inhibited. In addition, in those areas where titanium nitride local interconnect is to be formed between diffused areas, the extra thickness provided by the top titanium nitride layer adds in the integrity of the conductive layers. By conducting the silicidation in a nitride atmosphere, diffusion of the nitride from the titanium nitride layer into the titanium layer and substitution of those lost nitrogen atoms by the atmosphere occurs thus providing a blocking layer for the formation of titanium silicide shorts.

8 Claims, 2 Drawing Sheets

SELECTIVE SILICIDATION PROCESS USING A TITANIUM NITRIDE PROTECTIVE LAYER

BACKGROUND AND SUMMARY OF THE INVENTION

The present invention relates to integrated circuits and to methods for manufacturing them.

FIELD OF THE INVENTION

The present invention relates to the field of integrated circuit technology. More specifically, the present invention relates to a method for providing highly conductive regions in integrated circuitry.

BACKGROUND OF THE INVENTION

One technique for increasing the conductivity of regions integrated circuitry is direct react silicidation. In direct react silicidation, a layer of metal, such as titanium, is deposited on the surface of an integrated circuit. The structure is then heated to cause the metal to react with the exposed silicon surfaces of the integrated circuit to product titanium silicide. The unreacted metal is then removed by etching. This process is shown in Tasch, et al., U.S. Pat. No. 4,384,301, issued May 17, 1983 and assigned to the assignee of this application. This technique suffers from a shorting problem. During the direct react process, silicon out diffuses into the layer of titanium to provide a titanium silicide bridge between adjacent conductive regions. This causes an unwanted short. One technique for eliminating these unwanted shorts is shown in Lau, U.S. Pat. No. 4,545,116, issued Oct. 8, 1985 and assigned to the assignee of this application. In the method of Lay, the direct reaction step is performed in a nitrogen atmosphere. Titanium reacts with nitrogen to produce titanium nitride, which is relatively easily etched. Thus a competitive reaction process takes place whereby portions of the titanium in contact with the silicon form titanium silicide and those regions that are not in contact with the silicon form titanium nitride. The titanium nitride is then removed by etching.

Another advantage of the titanium nitridation process indirect react silicidation, is that titanium nitride provide a good conductor and thus may be patterned and used as an interconnection in the integrated circuit. This technique is shown in Holloway, et al., U.S. Pat. No. 4,657,628, issued Apr. 14, 1987 and assigned to the assignee of this applicaton. Titanium nitride local interconnect is particularly helpful in the connection of diffused regions of opposite conductivity type. One problem with the use of this local interconnect method is the unequal thicknesses of the local interconnect layer. The titanium layer must be thin enough so that substantial out diffusion and thus shorting between silicided regions does not occur. However, Because this layer is thin, the titanium nitride layer is relatively thin and develops problems with coverage over topography on the integrated circuit.

Another problem with the direct react silicidation process is the formation of titanium oxides. Titanium oxide is a very stable molecule and thus is difficult to etch. Oxide can enter the process by exposure of the titanium coated wafers to the atmosphere or by contaminating oxygen in the reaction chamber. Several methods have been proposed to combat this problem. These methods involve the coding of the titanium layer with various materials. In Tang, et al., U.S. Pat. No. 4,690,730, issued Sept. 31, 1987, a layer of silicon dioxide is formed on the surface of the titanium layer. The layer of silicon dioxide forms a barrier to prevent oxidation of the titanium layer, but some oxide does react with the titanium from the silicon dioxide. Thus, this method is unacceptable.

In Tseng, et al., "a new oxidation-resistance self-aligned TiSi$_2$ process" IEEE Electron Device Letters, Vol. EDL7, No. 11, November 1986, pages 623 and 624, a layer of amorphous silicon is deposited on the surface of the titanium layer. However, this will provide a conductive layer overall which must be patterned to provide the apropriate silicide regions, because the silicon layer will react to provide silicide. Thus, the self-aligned features of direct react silicon as shown in Tasch, et al. are lost.

In Park, et al., "Mo/Ti bilayer metallization for a self-aligned TiSi$_2$ process", Journal of Vacuum Science Technology, April-June 1984, pages 259 through 262, a molybdenum layer is formed on top of the titanium layer. The reference layer suggests that the molybdenum layer provides an effective barrier to prevent the oxidation of the titanium. The experiment in Park, et al. involved the coding of one half of a wafer with the molybdenum titanium stack and leaving the titanium exposed on the other half of the wafer. The results in Park, et al. suggested that the molybdenum provided an effective oxidation barrier. However, further experimentation using a layer of molybdenum overall suggests that the Park, et al. experiment was flawed because of the oxygen consuming effect of the exposed titanium. It has been determined that the molybdenum layer does not provide an effective barrier against oxygen.

SUMMARY OF THE INVENTION

The present invention provides a method for inhibiting the oxidation of a titanium layer during the direct reaction of the titanium with exposed silicon areas of an integrated circuit. In one embodiment of the present invention, a titanium nitride layer is formed on the surface of the titanium layer in the reactor where the titanium layer is deposited. The titanium nitride layer provides an effective barrier against oxidation. Thus, the formation of titanium dioxide is inhibited.

In addition, in those areas where titanium nitride local interconnect is to be formed between diffused areas, the extra thickness provided by the top titanium nitride layer adds in the integrity of the conductive layers. By conducting the silicidation in a nitride atmosphere, diffusion of the nitride from the titanium nitride layer into the titanium layer and substitution of those lost nitrogen atoms by the atmosphere occurs thus providing a blocking layer for the formation of titanium silicide shorts.

DETAILED DESCRIPTION OF THE DRAWINGS

Figure 1:
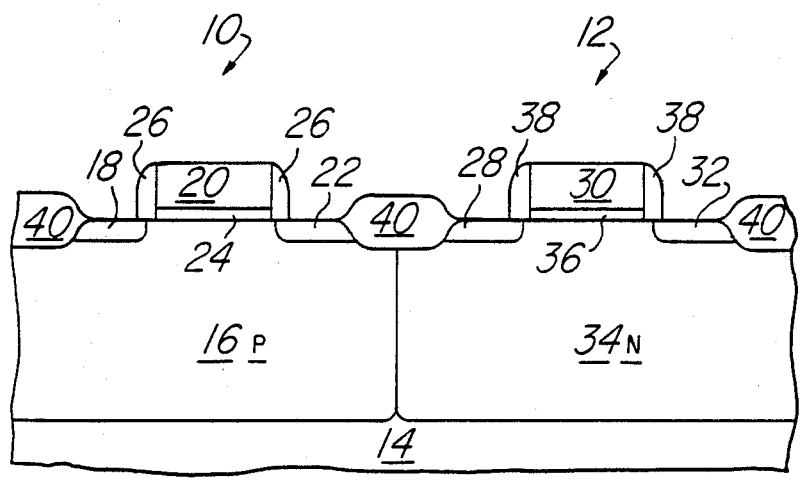
FIGS. 1 through 4 are side view schematic diagrams illustrating the processing steps which are one embodiment of the present invention.

FIGS. 1 through 4 are side view schematic diagrams illustrating the processing steps of one embodiment of the present invention. FIG. 1 shows N channel transistor 10 and P channel transistor 12, each formed in substrate 14. N channel transistor 10 is formed in P well 16 and comprises source region 18, gate 20 and drain region 22. Gate 20 is separated from P well 16 by gate oxide 24. Sidewall oxide layers 26 are formed on the sides of gate 20.

P channel transistor 12 comprises source region 28, gate 30 and drain region 32. Gate 30 is separated from N well 34 by gate oxide layer 36. Sidewall oxide layers 38 are formed on the sides of gate 30. Field oxide regions 40 separate transistors 10 and 12 from each other and adjacent active devices.

Figure 2:
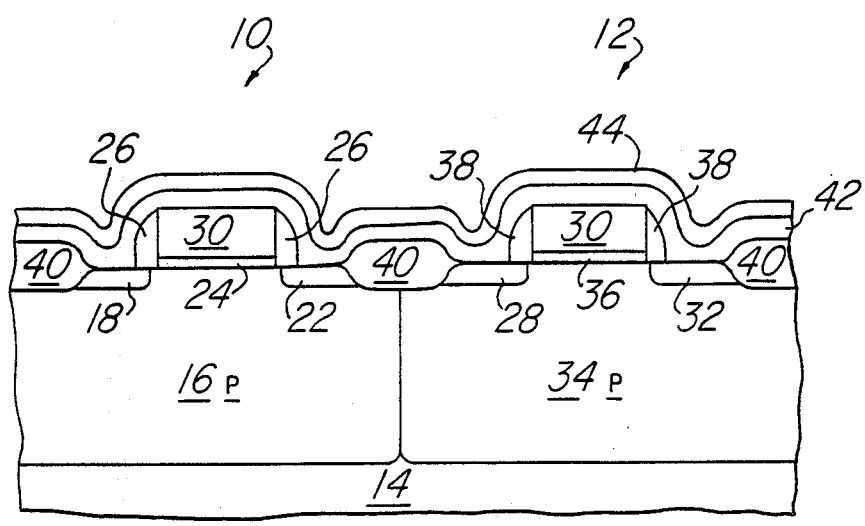

A layer of titanium is then sputtered onto the surface of the structure of FIG. 1 to provide titanium layer 42 as shown in FIG. 2. Titanium layer 42 is approximately 1,000 Angstroms thick. Titanium nitride layer 44 is then formed on the surface of titanium layer 42 by sputtering of titanium nitride or chemical vapor deposition of titanium nitride as illustrated in Price, et al., U.S. Pat. No. 4,570,328, issued Feb. 18, 1986. The deposition of titanium nitride layer 44 is preferably performed in the same reactor used for the deposition of titanium layer 42. Titanium nitride layer 44 is approximately 1,000 Angstroms thick. This minimizes the opportunity for oxygen contact of titanium layer 42 and thus minimizes the formation of titanium oxide.

Figure 3:
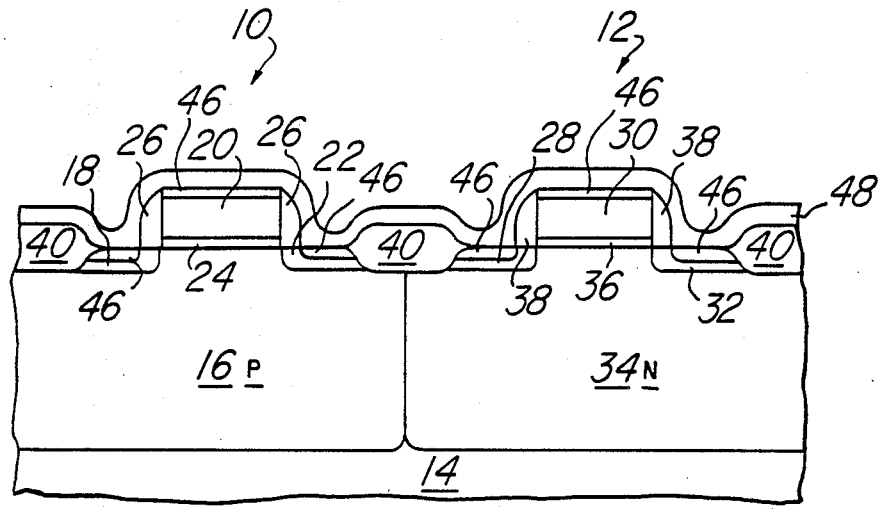

The structure of FIG. 2 is then subjected to a heating step in a nitrogen atmosphere at a temperature of approximately 700° C. for approximately 30 minutes. This causes titanium layer 42 to react with the silicon areas of substrate 14 and polycrystalline silicon gates 20 and 30 to form titanium silicide regions 46 as shown in FIG. 3. In addition, the portions of titanium layer 42 which do not react to form titanium silicide combine with titanium nitride layer 44 to provide titanium nitride layer 48.

Figure 4:
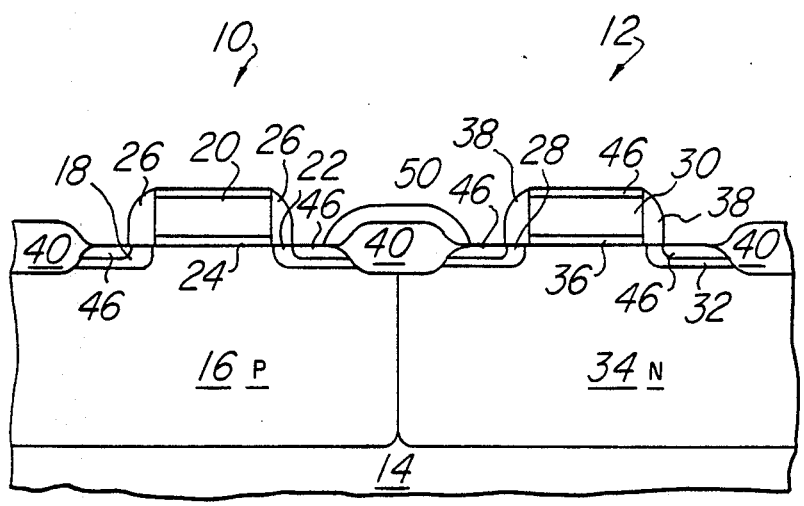

Titanium nitride layer 48 is then patterned to provide an example interconnection 50 as shown in FIG. 4. The resulting structure is shown in FIG. 4.

Although specific embodiments of the present invention are disclosed herein, they are not to be construed as limiting the scope of the present invention. The present invention is limited only by the claims appended hereto.

What is claimed is:

1. A method for forming high conductivity regions in selected regions of a silicon integrated circuit, comprising the steps of:
    depositing a layer of titanium overall said silicon integrated circuit;
    depositing a layer of titanium nitride on said layer of titanium;
    heating said integrated circuit to a temperature sufficient to cause said layer of titanium to react with said selected regions of said silicon integrated circuit to form titanium silicide;
    patterning and etching said layer of titanium nitride to provide conductive titanium nitride connection between elements of said integrated circuit said etching removing said layer of titanium nitride from above said titanium silicide where said silicide is not in contact with said conductive connection;

2. The method of claim 1 wherein said selected regions comprise crystalline silicon.

3. The method of claim 1 wherein said selected regions comprise polycrystalline silicon.

4. A method as in claim 1 wherein said selected regions comprises a layer of polycrystalline silicon separated from the substrate of said integrated circuit by an insulating layer, further comprising the step of forming sidewall oxide layers on the sides of said layer of polycrystalline silicon.

5. A method for forming high conductivity regions in selected regions of a silicon integrated circuit, comprising the steps of:
    placing said silicon integrated circuit in a controlled environment chamber and depositing a layer of titanium overall said silicon integrated circuit;
    depositing a layer of titanium nitride on said layer of titanium in said chamber without removing said integrated circuit from said chamber;
    heating said integrated circuit to a temperature sufficient to cause said layer of titanium to react with said selected regions of said silicon integrated circuit to form titanium silicide;
    patterning and etching said layer of titanium nitride to provide conductive titanium nitride connection between elements of said silicon integrated, said etching removing said layer of titanium nitride from above said titanium silicide where said silicide is not in contact with said conductive connection.

6. The method of claim 5 wherein said selected regions comprise crystalline silicon.

7. The method of claim 5 wherein said selected regions comprise polycrystalline silicon.

8. A method as in claim 5 wherein said selected regions comprise a layer of polycrystalline silicon separated from the substrate of said integrated circuit by an insulating layer, further comrising the step of forming sidewall oxide layers on the sides of said layer of polycrystalline silicon.

* * * * *